(12) United States Patent
Kang

(10) Patent No.: US 7,595,556 B2
(45) Date of Patent: Sep. 29, 2009

(54) SEMICONDUCTOR DEVICE AND METHOD FOR MANUFACTURING THE SAME

(75) Inventor: Jin Ah Kang, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 224 days.

(21) Appl. No.: 11/567,681

(22) Filed: Dec. 6, 2006

(65) Prior Publication Data

US 2007/0145597 A1   Jun. 28, 2007

(30) Foreign Application Priority Data

Dec. 28, 2005   (KR) .................... 10-2005-0132728

(51) Int. Cl.
*H01L 21/00* (2006.01)

(52) U.S. Cl. .................. 257/760; 257/761; 257/762; 257/764; 257/774; 257/E21.576; 257/E21.585; 257/E21.591; 257/E23.145; 438/612; 438/614; 438/618; 438/637; 438/672

(58) Field of Classification Search ......... 438/637–640, 438/622, 672–686, 612–619; 257/E21.576, 257/585, 591, E23.145, 751, 758, 760–764, 257/774

See application file for complete search history.

(56) References Cited

U.S. PATENT DOCUMENTS

| | | | |
|---|---|---|---|
| 6,492,735 B1 * | 12/2002 | Matsubara | 257/760 |
| 6,607,978 B2 * | 8/2003 | Matsubara | 438/628 |
| 2002/0036352 A1 * | 3/2002 | Kim et al. | 257/774 |
| 2002/0177271 A1 * | 11/2002 | Lee et al. | 438/239 |
| 2002/0185736 A1 * | 12/2002 | Tanaka | 257/750 |
| 2003/0003727 A1 * | 1/2003 | Matsubara | 438/672 |
| 2003/0012117 A1 * | 1/2003 | Ogawa et al. | 369/200 |
| 2004/0018697 A1 * | 1/2004 | Chung | 438/437 |
| 2004/0065958 A1 * | 4/2004 | Hachisuka et al. | 257/758 |
| 2004/0150110 A1 * | 8/2004 | Usami et al. | 257/756 |
| 2004/0175920 A1 * | 9/2004 | Derderian et al. | 438/620 |
| 2005/0023701 A1 * | 2/2005 | Kajita et al. | 257/774 |
| 2005/0186793 A1 * | 8/2005 | Omoto et al. | 438/687 |

FOREIGN PATENT DOCUMENTS

| | | |
|---|---|---|
| KR | 100270955 | 8/2000 |
| KR | 1020010090154 | 10/2001 |

* cited by examiner

*Primary Examiner*—Michael S Lebentritt
(74) *Attorney, Agent, or Firm*—Sherr & Vaughn, PLLC

(57) ABSTRACT

Embodiments relate to a semiconductor device and a method for manufacturing the same. According to embodiments, the semiconductor device may include a semiconductor substrate formed with a metal interconnection, a first interlayer dielectric layer formed on the metal interconnection and having a first contact plug, a second interlayer dielectric layer formed on the first interlayer dielectric layer and having a second contact plug, and a third interlayer dielectric layer formed on the second interlayer dielectric layer and having a third contact plug, wherein the first to third contact plugs are connected to each other.

12 Claims, 6 Drawing Sheets

SEMICONDUCTOR DEVICE AND METHOD FOR MANUFACTURING THE SAME

The present application claims priority under 35 U.S.C. 119 and 35 U.S.C. 365 to Korean Patent Application No. 10-2005-0132728 (filed on Dec. 28, 2005), which is hereby incorporated by reference in its entirety.

BACKGROUND

Embodiments relate to a semiconductor device. Embodiments may also relate to a structure of a semiconductor device and a method for manufacturing the same.

Generally, in a process of manufacturing a semiconductor device, an insulating layer may be formed between a junction part and a conductive layer or between conductive layers, and the connection between the junction part and the conductive layer or the connection between the connection layers may be achieved through holes formed in the insulating layer.

FIG. 1 is an example sectional view showing a structure of a related art semiconductor device, and FIG. 2 is an example photographic view showing an example problem that may occur in a related art semiconductor device.

Referring to FIG. 1, first conductive layer 11 may be formed on semiconductor device 10 so as to connect layers to each other, and interlayer dielectric layer 12, which may include a contact hole exposing a portion of first conductive layer 11, may be formed on first conductive layer 11.

In addition, barrier metal layer 14 may be formed along a surface of interlayer dielectric layer 12 including the contact hole, and second conductive layer 15 for forming a contact plug may be formed on barrier metal layer 14 such that the contact hole may be filled with conductive layer 15.

However, as semiconductor devices have become more highly integrated, a size of the contact hole may become reduced, so an aspect ratio may increase during a gap fill process for the barrier metal layer and the contact hole.

Referring to FIGS. 1 and 2, as a size of a contact hole decreases and the aspect ration increases as described above, an upper part of the contact hole, instead of the lower part of the contact hole, may be first filled with barrier metal layer 14 and second conductive layer 15, and may cause a gap-fill failure.

That is, conductive layer 15 may overhang out of an upper part of the contact hole and may become stuck thereto. Voids may thus be created in the contact hole, which may cause gap-fill failure. For this reason, various problems such as increased resistance, reduced yield rate, and poor reliability may be caused.

SUMMARY

Embodiments relate to a semiconductor device and a method for manufacturing the same that may prevent a void from occurring in the process of forming a contact plug filling the inner part of a contact hole.

In embodiments, a semiconductor device may include a semiconductor substrate formed with a metal interconnection, a first interlayer dielectric layer formed on the metal interconnection and having a first contact plug, a second interlayer dielectric layer formed on the first interlayer dielectric layer and having a second contact plug, and a third interlayer dielectric layer formed on the second interlayer dielectric layer and having a third contact plug, wherein the first to third contact plugs are connected to each other.

In embodiments, a method for manufacturing a semiconductor device may include forming a first interlayer dielectric layer on a semiconductor substrate, forming a first contact hole in the first interlayer dielectric layer, and then forming a first contact plug in the first contact hole, forming a second interlayer dielectric layer on the first interlayer dielectric layer, forming a second contact hole in the second interlayer dielectric layer, and then forming a second contact plug in the second contact hole, forming a third interlayer dielectric layer on the second interlayer dielectric layer, and forming a third contact hole in the third interlayer dielectric layer, and then forming a third contact plug in the third contact hole.

DETAILED DESCRIPTION OF EMBODIMENTS

Figure 1:
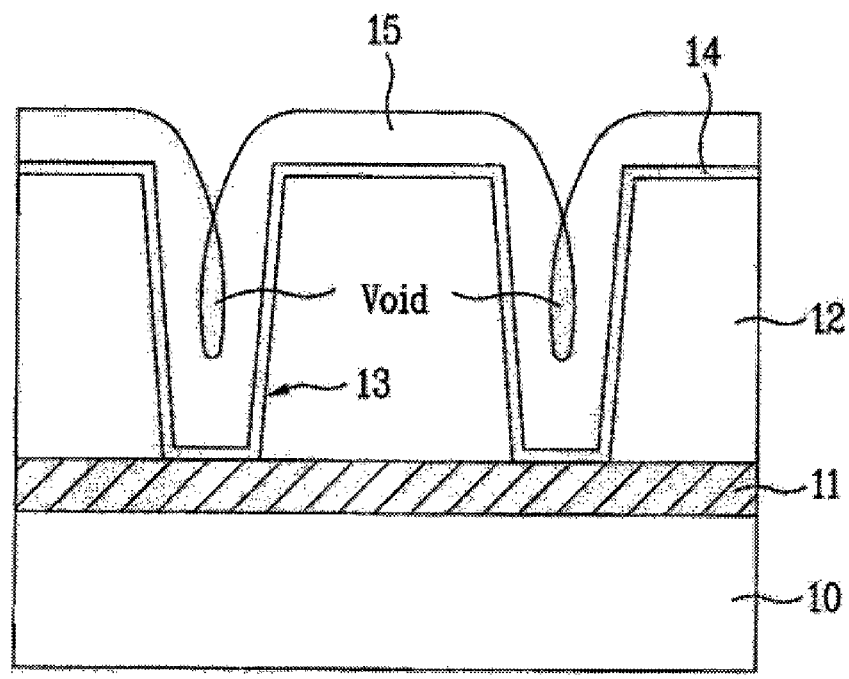
FIG. 1 is an example section view illustrating a related art semiconductor device.
Figure 2:
FIG. 2 is an example photographic view illustrating a problem that may occur in a related art semiconductor device.
Figure 3:
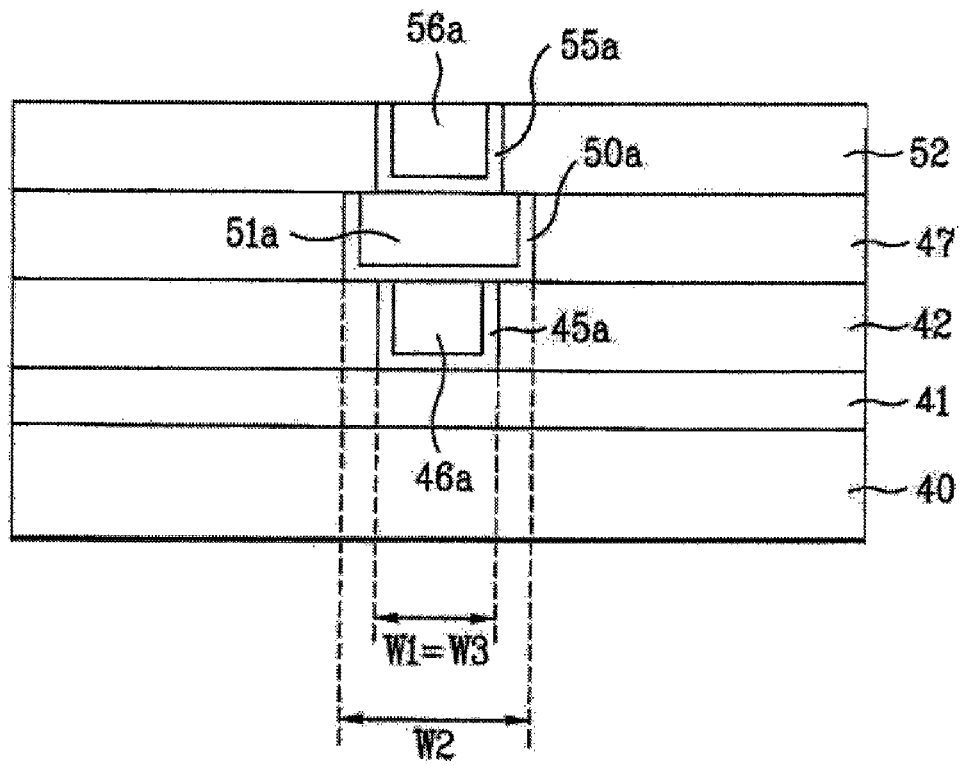
FIG. 3 is an example sectional view illustrating a semiconductor device according to embodiments.

Referring to FIG. 3, a semiconductor device according to embodiments may include semiconductor substrate 40 formed thereon with lower metal interconnection 41 that may be used for interlayer connection.

Lower metal interconnection 41 may be formed thereon with first interlayer dielectric layer 42, and first interlayer dielectric layer 42 may include first contact hole 44 (see FIG. 4) having a first width W1.

First barrier metal layer 45a and first contact plug 46a may be formed in first contact hole 44.

Second interlayer dielectric layer 47 may be formed on first interlayer dielectric layer 42. Second contact hole 49 (see FIG. 7), which may have a second width W2 larger than the first width W1, may be formed on second interlayer dielectric layer 47.

Second barrier metal layer 50a and second contact plug 51a may be formed in second contact hole 49.

In embodiments, second contact hole 49 may be formed with a width that may enable an exposure of first contact hole 44 and may be positioned at an upper side of first contact hole 44.

Third interlayer dielectric layer 52 may be formed on second interlayer dielectric layer 47. Third contact hole 54 (see FIG. 10), which may have a third width W3, may be formed in third interlayer dielectric layer 52.

Third barrier metal layer 55a and third contact plug 56a may be formed in third contact hole 54.

In embodiments, width W3 of third contact hole 54 may be narrower than width W2 of second contact hole 49. For example, first contact hole 44 and third contact hole 54 may be designed such that width W3 of third contact hole 54 may be identical to width W1 of first contact hole 44.

First, second, and third contact plugs 46a, 51a, and 56a may include tungsten W or other conductive materials suitable for a plug.

If width W2 of second contact hole 49 is wider than width W1 of first contact hole 44 or width W3 of third contact hole 54 as described above, it may be possible to widen an align margin for forming the contact holes.

According to embodiments, contact holes may be formed through several steps, and the barrier metal layer and the contact plug may be formed in each contact hole. This may solve problems derived from a gap fill failure due to an overhang in the contact hole while satisfying the least design requirement.

In embodiments, a semiconductor device may be highly integrated such that a width of a hole (particularly, a via hole) may be reduced, and it may be possible to prevent an occurrence of a hole gap fill failure even though an aspect ratio may increase.

Hereinafter, a method for manufacturing a semiconductor device according to embodiments will be described with reference to FIGS. 4 to 12.

Figure 4:
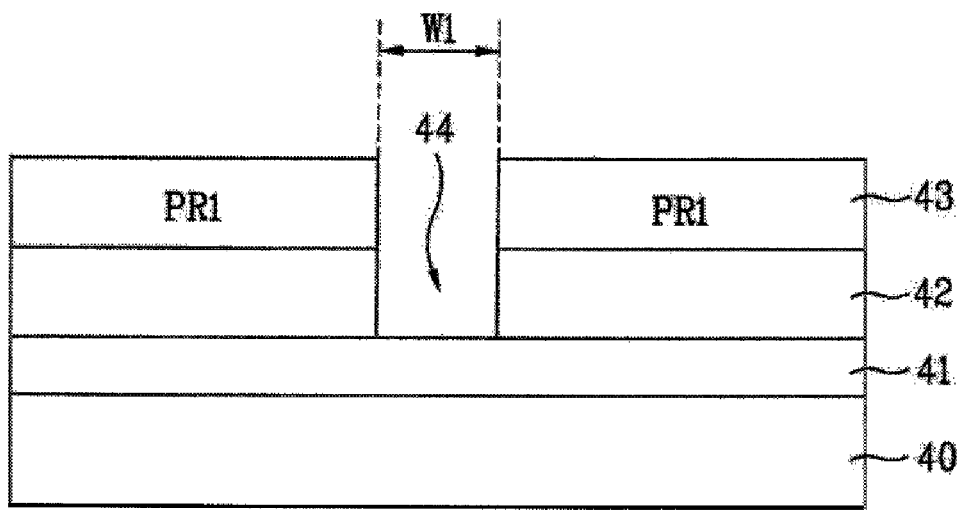
FIGS. 4 to 12 are sectional views illustrating a method for manufacturing a semiconductor device according to embodiments.

Referring to FIG. 4, a first conductive layer may be deposited on semiconductor substrate 40, and may thereby form lower metal interconnection 41, and the first interlayer dielectric layer 42 may be formed on lower metal interconnection 41.

First photoresist film (PR1) 43 may be coated on first interlayer dielectric layer 42. First photoresist film (PR1) 43 may be patterned, for example, through an exposure and development process such that a prescribed area (an area in which first contact hole 44 may be formed) may be exposed.

First interlayer dielectric layer 42 may be etched, for example using first photoresist film 43 as a mask, such that lower metal interconnection 41 (i.e. first conductive layer) may be exposed. First contact hole 44 having first width W1 may thereby be formed. In embodiments, first contact hole 44 may have a width satisfying a design rule.

Figure 5:
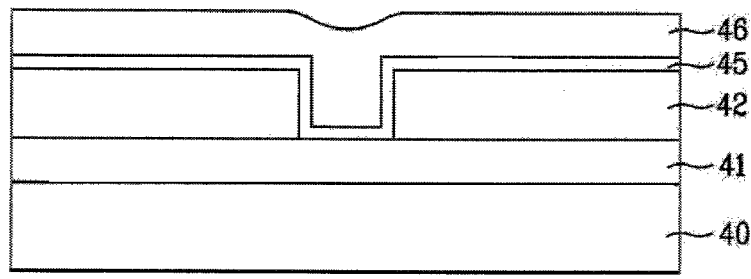

Referring to FIG. 5, first photoresist film 43 may be removed. Second conductive layer 45 and the third conductive layer 46 may be sequentially deposited on first interlayer dielectric layer 42 including first contact hole 44.

In embodiments, third conductive layer 46 may include Tungsten W. Third conductive layer 46 may include other conductive materials which can be employed for plugs.

Figure 6:
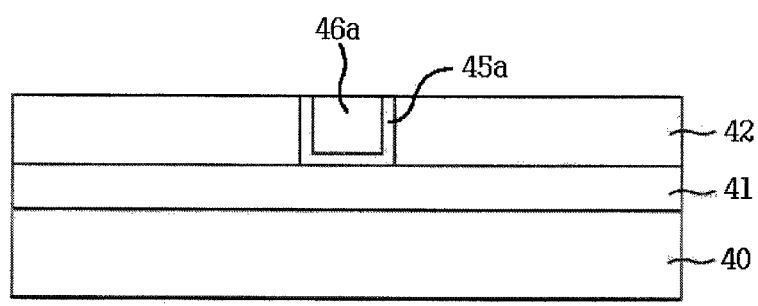

Referring to FIG. 6, second conductive layer 45 and third conductive layer 46 may be planarized, for example through a chemical mechanical polishing (CMP) process.

Accordingly, first barrier metal layer 45a and first contact plug 46a may be formed in first contact hole 44.

Figure 7:
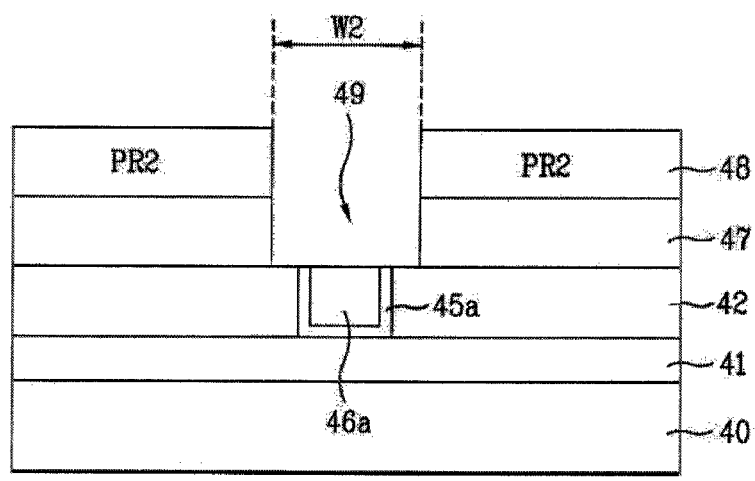

Referring to FIG. 7, second interlayer dielectric layer 47 and a second photoresist film (PR2) 48 may be deposited on first interlayer dielectric layer 42, which may include first barrier metal layer 45a and first contact plug 46a. Second photoresist film 48 may be selectively patterned, for example through an exposure and development process such that a predetermined area (an area in which second contact hole 49 may be formed) may be exposed.

Second interlayer dielectric layer 47 may be etched, for example by using second photoresist film 48 as a mask such that first barrier metal layer 45a and first contact plug 46a may be exposed. Second contact hole 49, which may have width W2, may thereby be formed. In embodiments, width W2 of second contact hole 49 may be wider than width W1 of first contact hole 44.

Figure 8:
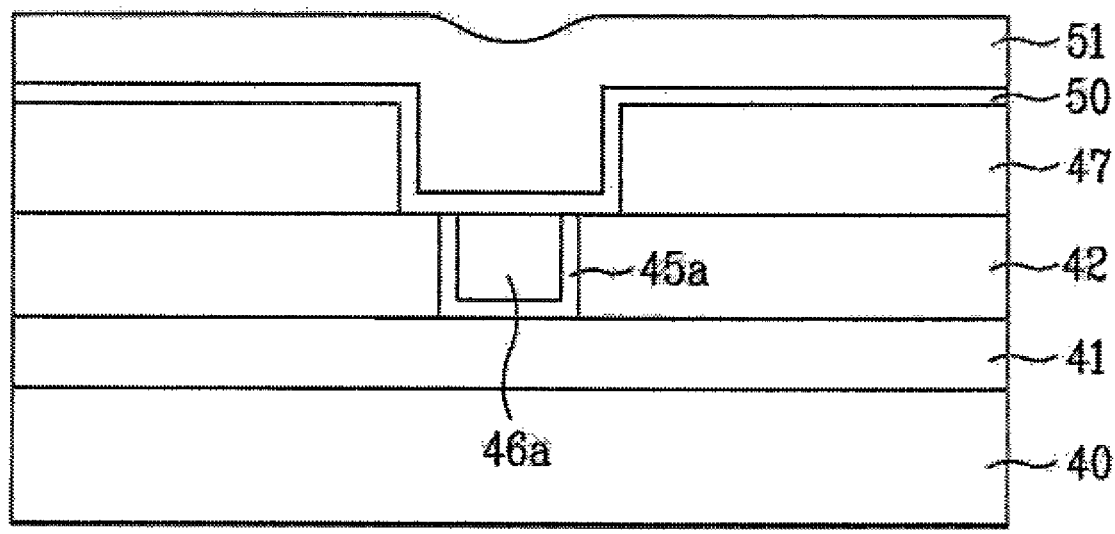

Referring to FIG. 8, after removing second photoresist film 48, fourth conductive layer 50 and fifth conductive layer 51 may be sequentially deposited on second interlayer dielectric layer 47 including second contact hole 49.

In embodiments, fifth conductive layer 51 may include Tungsten W. In addition, fifth conductive layer 51 may include other conductive materials which can be used as a plug.

Figure 9:
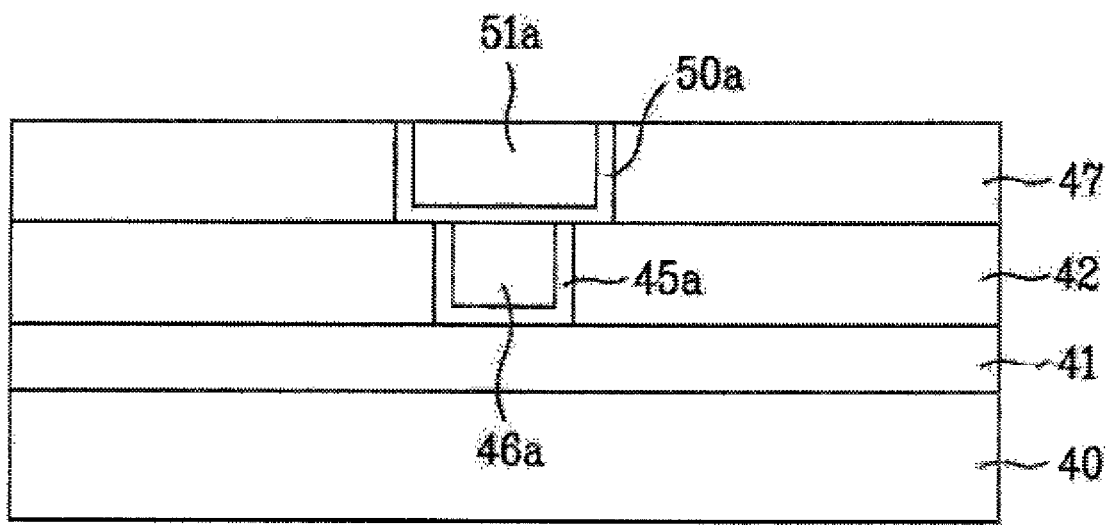

Referring to FIG. 9, fourth conductive layer 50 and fifth conductive layer 51 may be planarized, for example through a CMP process.

Second barrier metal layer 50a and second contact plug 51a may accordingly be formed in second contact hole 49.

Second barrier metal layer 50a may be formed on first contact plug 46a and first barrier metal 45a.

Figure 10:
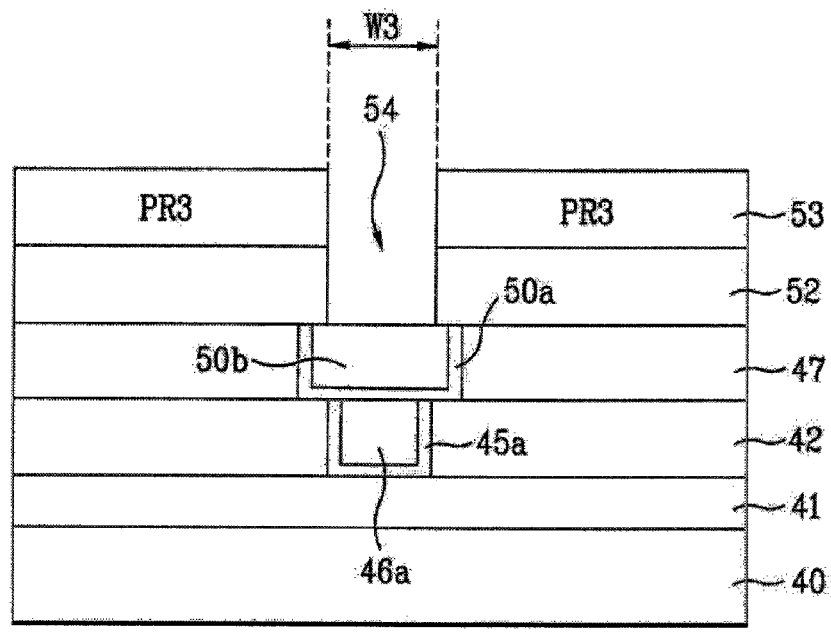

Referring to FIG. 10, second photoresist film 48 may be removed and third interlayer dielectric layer 52 and a third photoresist film (PR3) 53 may be deposited on second interlayer dielectric layer 47 (i.e. second insulating layer), which may include second barrier metal layer 50a and second contact hole 51a. Third photoresist film 53 may then be selectively patterned, for example through an exposure and development process such that a predetermined area (an area in which the third contact hole may be formed) may be exposed.

Third interlayer dielectric layer 52 may be etched, for example by using third photoresist film 53 as a mask such that second barrier metal layer 50a and second contact plug 51a may be exposed. Third contact hole 54 having width W3 may thereby be formed.

In embodiments, width W3 of third contact hole 54 may be narrower than width W2 of second contact hole 49. In addition, width W3 of third contact hole 54 may be identical to width W1 of first contact hole 44.

Figure 11:
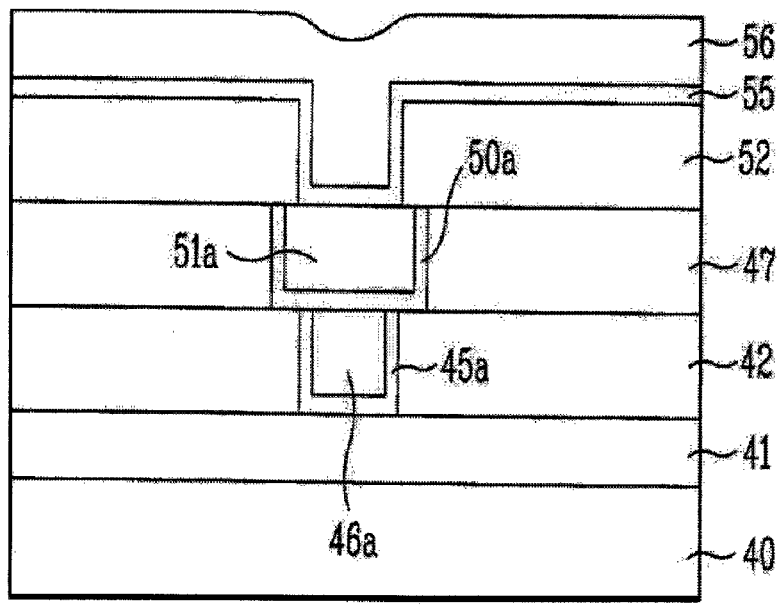

Referring to FIG. 11, third photoresist film 53 may be removed. Sixth conductive layer 55 and a seventh conductive layer 56 may be sequentially deposited on third interlayer dielectric layer 52 including third contact hole 54.

In embodiments, seventh conductive layer 56 may include tungsten W. Seventh conductive layer 56 may include other materials which can be used as a plug.

Figure 12:
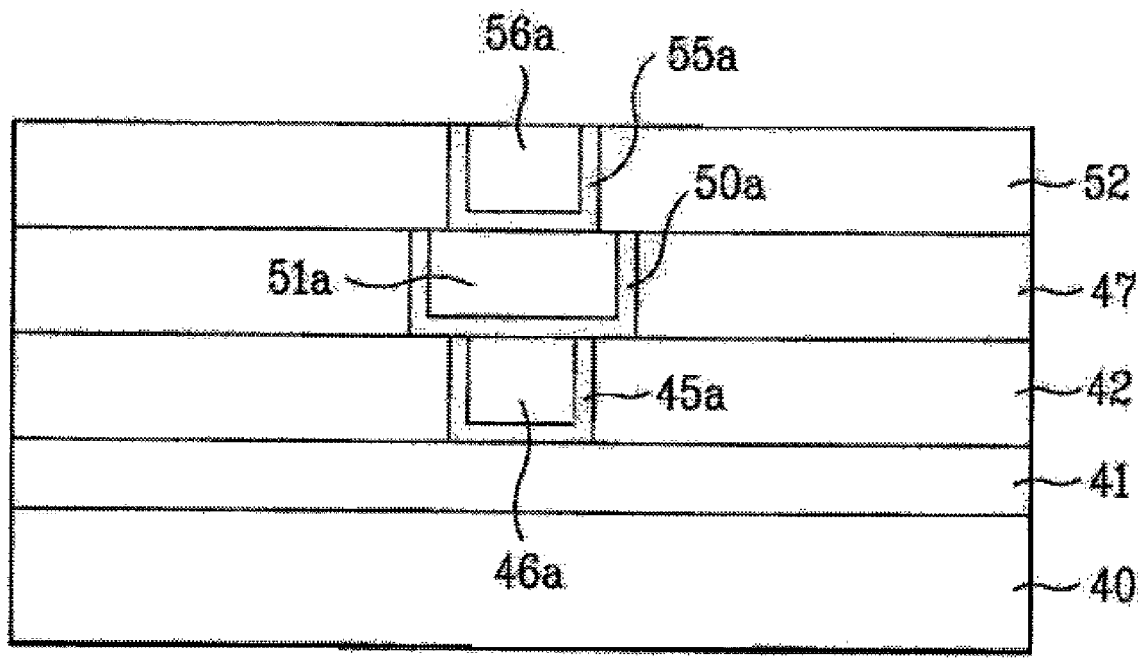

Referring to FIG. 12, sixth conductive layer 55 and seventh conductive layer 56 may be planarized, for example through a CMP process.

Third barrier metal layer 55a and third contact plug 56a may thus be formed in third contact hole 54.

Third barrier metal layer 55a may then be formed on second barrier metal layer 50a and second contact plug 51a.

According to embodiments, if width W2 of second contact hole 49 is larger than width W1 of first contact hole 44, a margin of an align pattern of third contact hole 54, which may be formed at an upper part of the semiconductor substrate, may be widened. Accordingly, it may be possible to prevent misalignment of third contact hole 54.

In addition, according to embodiments, the width of second contact plug 50b may be larger than the widths of first contact plug 46a and third contact plug 56a, and the width of first contact plug 46a may be identical to the width of third contact plug 56a.

According to embodiments, contact holes may be formed through several steps, and barrier metal layers and contact plugs may be formed in the contact holes, respectively.

In addition, according to embodiments, first, second, and third contact holes 44, 49, and 54 may have prescribed portions that may overlap with each other in a vertical direction.

In other words, the first to third contact plugs formed in the first to third contact holes may be connected to each other.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:
1. A device comprising:
   a semiconductor substrate formed with a metal interconnection;
   a first interlayer dielectric layer formed over the metal interconnection and having a first contact plug;

a second interlayer dielectric layer formed over the first interlayer dielectric layer and having a second contact plug; and a third interlayer dielectric layer formed over the second interlayer dielectric layer and having a third contact plug, wherein the first, second, and third contact plugs are configured to be in electrical contact with each other, wherein the first, second, and third interlayer dielectric layers are formed with first, second, and third contact holes configured to bury the first, second, and third contact plugs therein, respectively, and wherein a width of the second contact hole is larger than a width of at least one of the first contact hole and the third contact hole.

2. The device of claim 1, wherein the width of the first contact hole is identical to the width of the third contact hole.

3. The device of claim 1, further comprising first, second, and third barrier metal layers formed on the first, second, and third interlayer dielectric layers, respectively.

4. A device comprising:
   a metal interconnection formed over a semiconductor substrate;
   a first interlayer dielectric layer formed over the metal interconnection and having a first barrier metal layer and a first contact plug;
   a second interlayer dielectric layer formed over the first interlayer dielectric layer and having a second barrier metal layer and a second contact plug; and
   a third interlayer dielectric layer formed over the second interlayer dielectric layer and having a third barrier metal layer and a third contact plug,
   wherein the second barrier metal layer is formed over at least a portion of both the first contact plug and the first barrier metal layer,
   wherein the first, second, and third contact plugs are aligned in prescribed positions to enable interlayer connection,
   wherein a width of the second contact plug is larger than a width of at least one of the first contact plug and the third contact plug, and
   wherein the first, second, and third contact plugs are formed in first, second, and third contact holes that are formed in the first, second, and third interlayer dielectric layers.

5. The device of claim 4, wherein the third barrier metal layer is formed over both the second contact plug and the second barrier metal layer.

6. The device of claim 4, wherein the width of the first contact plug is identical to the width of the third contact plug.

7. The device of claim 4, wherein a width of the first contact plug is identical to a width of the third contact plug.

8. A method comprising:
   forming a first interlayer dielectric layer over a semiconductor substrate, wherein forming a lower metal interconnection is performed to achieve electrical connection before the first interlayer dielectric layer is formed;
   forming a first contact hole in the first interlayer dielectric layer, and forming a first contact plug in the first contact hole;
   forming a second interlayer dielectric layer over the first interlayer dielectric layer;
   forming a second contact hole in the second interlayer dielectric layer, and forming a second contact plug in the second contact hole;
   forming a third interlayer dielectric layer over the second interlayer dielectric layer; and
   forming a third contact hole in the third interlayer dielectric layer, and forming a third contact plug in the third contact hole,
   wherein a width of the second contact plug is larger than a width of at least one of the first contact plug and the third contact plug,
   wherein the second contact plug is formed to be in contact with the first contact plug, and the third contact plug is formed to be in contact with the second contact plug.

9. The method of claim 8, wherein the width of the first contact plug is identical to the width of the third contact plug.

10. The method of claim 8, further comprising forming first, second, and third barrier metal layers after forming the first, second, and third contact holes.

11. The method of claim 10, wherein the first, second, and third barrier metal layers are formed in the first, second, and third contact holes, respectively.

12. The method of claim 8, wherein a width of the third contact hole is identical to a width of the first contact hole.

* * * * *